United States Patent
Scott

(10) Patent No.: US 8,585,240 B2
(45) Date of Patent: Nov. 19, 2013

(54) LIGHT EMITTING DIODE LUMINAIRE

(75) Inventor: Keith Scott, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 504 days.

(21) Appl. No.: 12/334,262

(22) Filed: Dec. 12, 2008

(65) Prior Publication Data

US 2010/0149798 A1    Jun. 17, 2010

(51) Int. Cl.
*F21S 4/00* (2006.01)
*F21V 21/00* (2006.01)

(52) U.S. Cl.
USPC ............... 362/249.02; 362/311.02; 362/373; 362/800

(58) Field of Classification Search
USPC ............ 362/249.02, 311.02, 373, 545, 800
See application file for complete search history.

(56) References Cited

U.S. PATENT DOCUMENTS

| | | | |
|---|---|---|---|
| 5,278,432 A * | 1/1994 | Ignatius et al. | 257/88 |
| 5,374,812 A | 12/1994 | Chan et al. | |
| 6,634,770 B2 | 10/2003 | Cao | |
| 6,815,724 B2 | 11/2004 | Dry | |
| 6,864,513 B2 | 3/2005 | Lin et al. | |
| 2004/0105264 A1 | 6/2004 | Spero | |
| 2004/0208009 A1 * | 10/2004 | Mardon et al. | 362/373 |
| 2005/0243552 A1 | 11/2005 | Maxik | |
| 2005/0276053 A1 | 12/2005 | Nortrup et al. | |
| 2008/0165541 A1 | 7/2008 | Chou et al. | |
| 2008/0285271 A1 | 11/2008 | Roberge et al. | |
| 2008/0298059 A1 | 12/2008 | Schug et al. | |

FOREIGN PATENT DOCUMENTS

| | | |
|---|---|---|
| CN | 101220910 A | 7/2008 |
| JP | 2008177020 A | 7/2008 |
| JP | 2008192609 A | 8/2008 |
| WO | WO 2006/-079111 A2 | 7/2006 |

OTHER PUBLICATIONS

Office Action dated Nov. 21, 2012 from related Korean Application No. 2011-7016189.
Office Action dated Jan. 15, 2013 from Japanese Application No. 2011-540737.
Office Action dated Sep. 27, 2012 from Chinese Application No. 200980156152.8.
International Preliminary Report on Patentability for PCT/US2009/062619 dated Jan. 11, 2011.
International Search Report and the Written Opinion for PCT/US2009/062619 dated Dec. 9, 2009, mailing date Dec. 23, 2009.

* cited by examiner

*Primary Examiner* — Jason Moon Han
(74) *Attorney, Agent, or Firm* — Arent Fox LLP

(57) ABSTRACT

A luminaire includes a light fixture having an opening, at least one LED positioned within the light fixture to emit light through the opening, and a fan configured to cool said at least one LED.

14 Claims, 6 Drawing Sheets

LIGHT EMITTING DIODE LUMINAIRE

BACKGROUND

1. Field

The present disclosure relates to light emitting devices, and more particularly to light emitting diode luminaires.

2. Background

Light emitting diodes (LEDs) are attractive candidates for replacing conventional light sources such as incandescent and fluorescent lamps. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory.

Despite the advantages of using LEDs as light sources, consumer acceptance will depend, at least in part, on the adaptability of these sources into light fixtures currently using conventional light sources (i.e., incandescent or fluorescent lamps). LED light sources designed for direct replacement of conventional light sources could be instrumental in accelerating consumer acceptance, and thereby, revolutionize the lighting industry. Unfortunately, there exists significant challenges in designing LED light sources that directly replace existing light sources, such as incandescent light bulb for example.

SUMMARY

In one aspect of the disclosure, a luminaire includes a light fixture having an opening, at least one LED positioned within the light fixture to emit light through the opening, and a solid-state fan positioned within the light fixture to directly cool said at least one LED.

In another aspect of the disclosure, a luminaire includes at least one LED configured to emit light, a light fixture containing said at least one LED, wherein the light fixture comprises an opening configured to pass the light emitted from said at least one LED, and a solid-state fan positioned within the light fixture to directly cool said at least one LED.

In yet another aspect of the disclosure, a luminaire includes a light fixture having an opening, at least one LED positioned within the light fixture to emit light through the opening, wherein said at least one LED is not in thermal contact with a heat sink, and a solid-state fan positioned within the light fixture to cool said at least one LED.

In a further aspect of the disclosure, a luminaire includes a light fixture having an opening, at least one LED positioned within the light fixture to emit light through the opening, and a fan positioned within the light fixture to directly cool said at least one LED, wherein the fan contains no moving parts.

It is understood that other aspects of the present invention will become readily apparent to those skilled in the art from the following detailed description, wherein it is shown and described only exemplary configurations of an LED by way of illustration. As will be realized, the present invention includes other and different aspects and its several details are capable of modification in various other respects, all without departing from the spirit and scope of the present invention. Accordingly, the drawings and the detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein.

DETAILED DESCRIPTION

Figure 1:
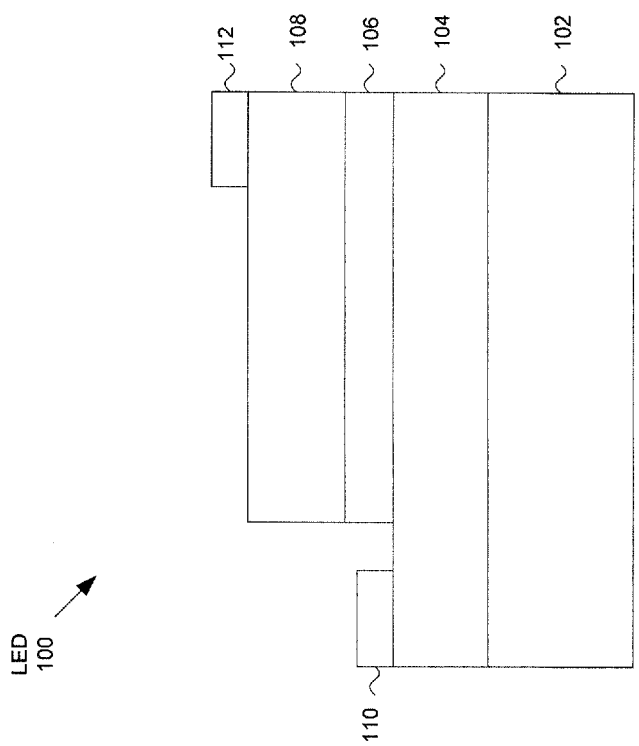
FIG. 1 is a conceptual cross-sectional view illustrating an example of an LED.

The present invention is described more fully hereinafter with reference to the accompanying drawings, in which various aspects of the present invention are shown. This invention, however, may be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of an LED luminaire will now be presented. However, as those skilled in the art will readily appreciate, these aspects may be extended to aspects of LED luminaries without departing from the invention. The LED luminaire may be configured as a direct replacement for conventional luminaries, including, by way of example, recessed lights, surface-mounted lights, pendant lights, sconces, cove lights, track lighting, under-cabinet lights, landscape or outdoor lights, flood lights, search lights, street lights, strobe lights, bay lights, strip lights, industrial lights, emergency lights, balanced arm lamps, accent lights, background lights, and other light fixtures.

As used herein, the term "luminaire" shall mean a light fixture with a light source. The term "light fixture" shall include all components of the luminaire other than the light source (e.g., a shell or housing, a fan for cooling the light source, a reflector for directing the light, etc.). The term "LED luminaire" shall mean a luminaire with a light source comprising one or more LEDs. LEDs are well known in the art, and therefore, will only briefly be discussed to provide a complete description of the invention.

FIG. 1 is a conceptual cross-sectional view illustrating an example of an LED. An LED is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred respectively as n-type or p-type semiconductor regions. Referring to FIG. 1, the LED 100 includes an n-type semiconductor region 104 and a p-type semiconductor region 108. A reverse electric field is created at the junction between the two regions, which cause the electrons and holes to move away from the junction to form an active region 106. When a forward voltage sufficient to overcome the reverse electric field is applied across the p-n junction through a pair of electrodes 110, 112, electrons and holes are forced into the active region 106 and recombine. When electrons recombine with holes, they fall to lower energy levels and release energy in the form of light.

In this example, the n-type semiconductor region 104 is formed on a substrate 102 and the p-type semiconductor region 108 is formed on the active layer 106, however, the regions may be reversed. That is, the p-type semiconductor region 108 may be formed on the substrate 102 and the n-type semiconductor region 104 may formed on the active layer 106. As those skilled in the art will readily appreciate, the various concepts described throughout this disclosure may be extended to any suitable layered structure. Additional layers or regions (not shown) may also be included in the LED 100, including but not limited to buffer, nucleation, contact and current spreading layers or regions, as well as light extraction layers.

The p-type semiconductor region 108 is exposed at the top surface, and therefore, the p-type electrode 112 may be readily formed thereon. However, the n-type semiconductor region 104 is buried beneath the p-type semiconductor layer 108 and the active layer 106. Accordingly, to form the n-type electrode 110 on the n-type semiconductor region 104, a cutout area or "mesa" is formed by removing a portion of the active layer 106 and the p-type semiconductor region 108 by means well known in the art to expose the n-type semiconductor layer 104 therebeneath. After this portion is removed, the n-type electrode 110 may be formed.

Figure 2:
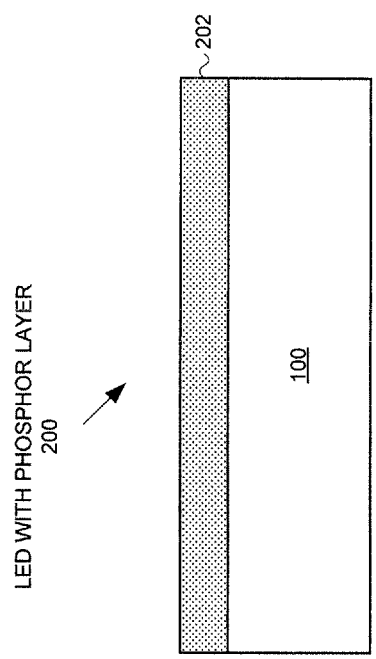
FIG. 2 is a conceptual cross-sectional view illustrating an example of an LED with a phosphor layer.

FIG. 2 is a conceptual cross-sectional view illustrating an example of a LED with a phosphor layer. In this example, a phosphor layer 202 is formed on the top surface of the LED 100 by means well known in the art. The phosphor layer 202 converts a portion of the light emitted by the LED 100 to light having a different spectrum from that emitted from the LED 100. A white LED light source can be constructed by using an LED that emits light in the blue region of the spectrum and a phosphor that converts blue light to yellow light. A white light source is well suited as a replacement lamp for conventional luminaires; however, the invention may be practiced with other LED and phosphor combinations to produce different color lights. The phosphor layer 202 may include, by way of example, multiple or different phosphor types, phosphor particles suspended in a carrier or be constructed from a soluble phosphor that is dissolved in the carrier.

Figure 3A:
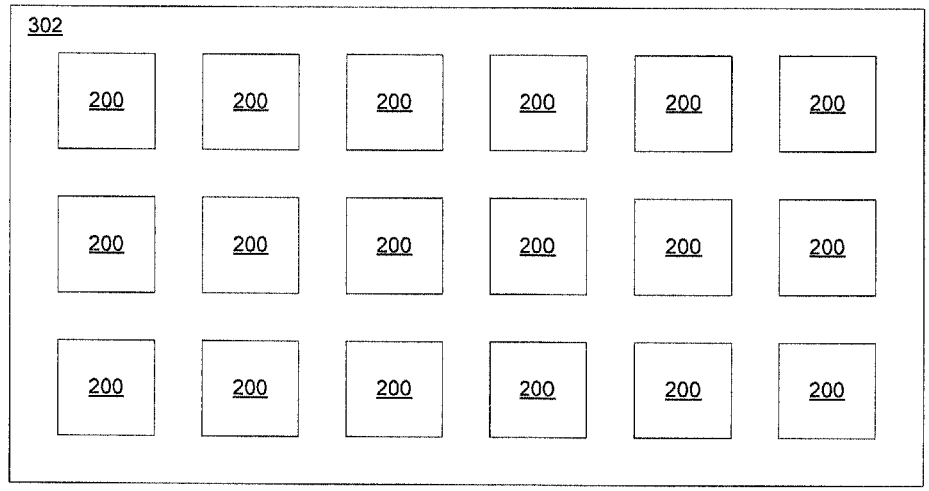
FIG. 3A is a conceptual top view illustrating an example of an LED array.
Figure 3B:
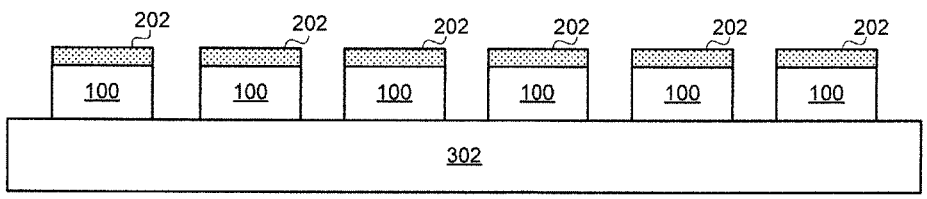
FIG. 3B is a conceptual cross-sectional view of the LED array of FIG. 3A.

In a configuration of an LED luminaire, an LED array may be used to provide increased light. FIG. 3A is a conceptual top view illustrating an example of an LED array, and FIG. 3B is a conceptual cross-sectional view of the LED array of FIG. 3A. In this example, a number of phosphor-coated LEDs 200 may be formed on a substrate 302 by means well known in the art. The bond wires (not shown) extending from the LEDs 200 may be connected to traces (not shown) on the surface of the substrate 302, which connect the LEDs 200 in a parallel and/or series or series-parallel fashion. Typically, the LEDs 200 may be connected in parallel streams of series LEDs with a current limiting resistor (not shown) in each stream. The substrate 302 may be any suitable material that can provide support to the LEDs 200 and can be mounted within a light fixture (not shown).

Figure 4A:
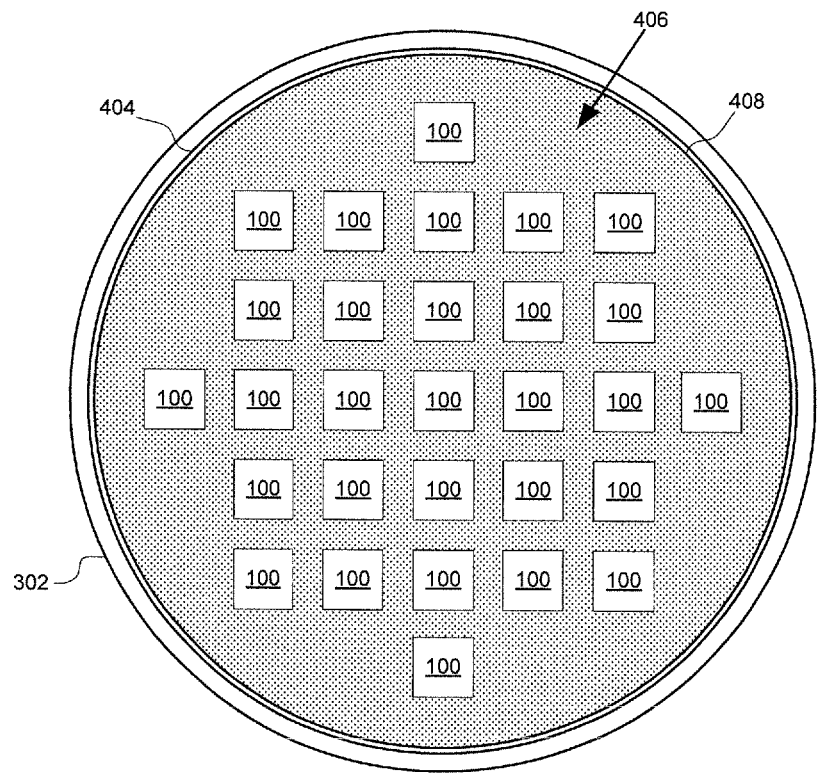
FIG. 4A is a conceptual top view illustrating an example of an alternative configuration of an LED array.
Figure 4B:
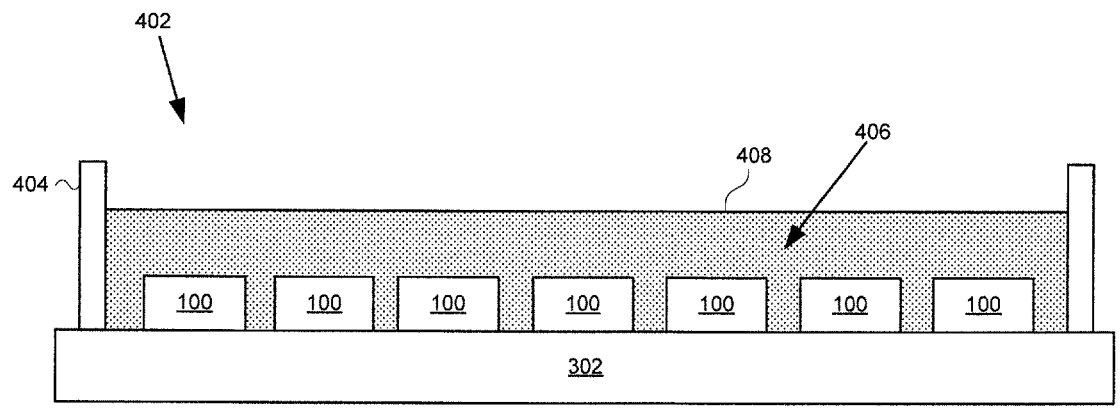
FIG. 4B is a conceptual cross-sectional view of the LED array of FIG. 4A.

FIG. 4A is a conceptual top view illustrating an example of an alternative configuration of an LED array, and FIG. 4B is a conceptual cross-sectional view of the LED array of FIG. 4A. In a manner similar to that described in connection with FIGS. 3A and 3B, a substrate 302 designed for mounting in a light fixture (not shown) may be used to support an array of LEDs 100. However, in this configuration, a phosphor layer is not formed on each individual LED. Instead, phosphor 406 is deposited within a cavity 402 bounded by an annular ring 404 that extends circumferentially around the outer surface of the substrate 302. The annular ring 404 may be formed by boring a cylindrical hole in a material that forms the substrate 302. Alternatively, the substrate 302 and the annular ring 404 may be formed with a suitable mold, or the annular ring 404 may be formed separately from the substrate 302 and attached to the substrate using an adhesive or other suitable means. In the latter configuration, the annular ring 404 is generally attached to the substrate 302 before the LEDs 100, however, in some configurations, the LEDs 400 may be attached first. Once the LEDs 100 and the annular ring 404 are attached to the substrate 302, a suspension of phosphor particles in a carrier may be introduced into the cavity 402. The carrier material may be an epoxy or silicone, however, carriers based on other materials may also be used. The carrier material may be cured to produce a solid material in which the phosphor particles are immobilized.

Figure 5:
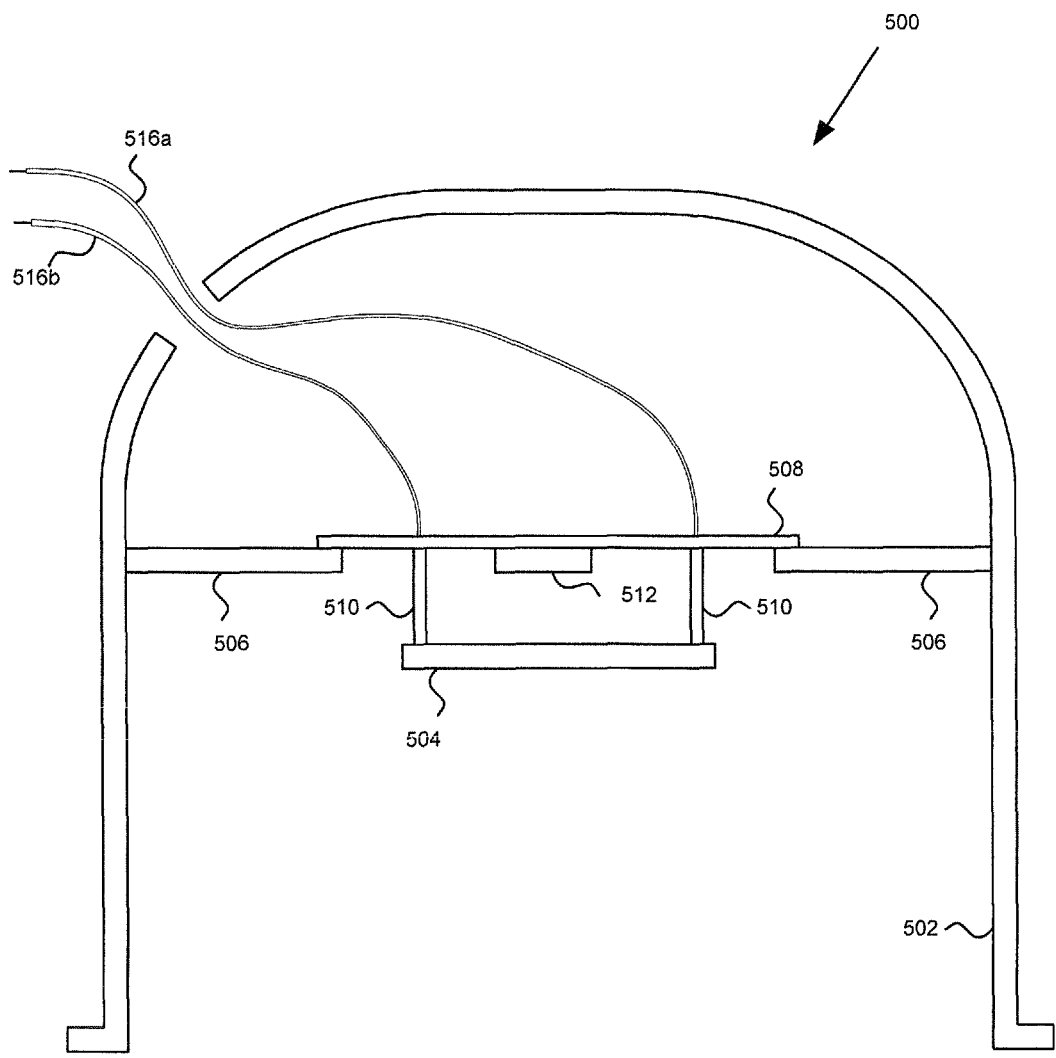
FIG. 5 is a conceptual side view of an LED luminaire.

FIG. 5 is a conceptual side view of an LED luminaire. The LED luminaire may include a light fixture 500, which may include a shell 502 made out of a heat conductive material, such as aluminum, for example. The shell 502 is shown with a cylindrical shape for recessed lighting applications, but may be configured for other lighting applications such as surface-mounted lighting, pendant lighting, sconce lighting, cove lighting, track lighting, under-cabinet lighting, landscape or outdoor lightings, street lighting, industrial lighting, emergency lighting, desk lighting, background lighting, and other lighting applications. Those skilled in the art will be readily able to determine the appropriate construction of a shell for any particular application.

An LED array 504 is positioned within the light fixture 502. The LED array 504 may take on various forms, including any one of the configurations discussed earlier in connection with FIGS. 2-4, or any other suitable configuration now known or developed in the future. Although an LED array is well suited for the LED luminaire, those skilled in the art will readily understand that the various concepts presented throughout this disclosure are not necessarily limited to array and may be extended to an LED luminaire with a single LED light source.

The light fixture 500 includes a base 506 for supporting a light source. The base 506 may be an integrated part of the shell 502, or attached by any suitable means. A plate 508 anchored to the base 506 carries the LED array 504. In one configuration of the LED luminaire, standoffs 510 extending from the plate 508 are used to separate the LED array 504 from the plate 508. This configuration provides a means for mounting a fan 512 in the vicinity of the LED array 504. The standoffs 510 may be non-conductive (e.g., plastic, ceramic) standoffs having conical heads that can be pushed through holes in the substrate of the LED array 504. Alternatively, the standoffs 510 may be adhered to the LED array 504, or alternatively, may include internal threads that allow the LED array 504 to be mounted with screws. Other ways to mount the LED array 504 will be readily apparent to those skilled in the art from the teachings presented throughout this disclosure. The plate 508 may be constructed from any suitable insulting material, including by way of example, plastic, cardboard, or similar material.

The fan 512 may be a solid-state fan. A solid-state fan is a device used to produce airflow with no moving parts. Fundamentally, a solid-state fan uses an electric charge on a conductor to ionize air, which results in ionized air molecules having the same polarity of the electric charge on the conductor. The electrode repels the like-charged ion molecules creating an electric or ionic wind. A non-limiting example of a solid-state fan is the RSD5 fan developed by Thorrn Micro Technologies, Inc. The RSD5 uses a series of live wires that produce an ion rich gas with free electrons for conducting electricity. The wires lie within uncharged conducting plates that are contoured into a half-cylindrical shape to partially envelope the wires. Within the electric field that results, the ions push neutral air molecules from the wire to the plate, generating air flow.

The positioning of the fan 512 on the plate 508 provides a means for directly cooling the LED array 504, thereby eliminating the need for a heat sink. As used herein, "directly" cooling means positioning the LED array 504 within the air flow generated by the fan 512. In contrast, an LED array that is "indirectly" cooled by a fan means that a thermally conductive material, which is attached to the LED array, is arranged within the air flow generated by the fan. By way of example, a fan that is used to cool a heat sink for an LED array would be a form of indirect cooling. Although the fan 512 is mounted directly above the LED array 504, the fan 512 may be located elsewhere in the light fixture 500 and still provide direct cooling of the LED array 504. Those skilled in the art will be readily able to determine the location of the LED array 504 and the fan 512 best suited for any particular application based on the overall design parameters.

The light fixture 500 may include a small aperture for routing wires 516a and 516b from a power source (not shown) to the LED array 504 and fan 512. In one configuration of the LED luminaire, the wires 516a and 516b may be routed from the power source to the LED array 504 through the plastic hollow standoffs 510 previously described. An AC-DC converter (not shown) may be used to generate a DC voltage from an AC power source generally found in a household, office building, or other facility. The DC voltage generated by the AC-DC converter may be provided to a driver circuit (not shown) configured to drive both the LED array 504 and the fan 512. The AC-DC converter and the driver circuit may be located on the plate 508, on the LED array 504, or anywhere else in the light fixture 500. In some applications, the AC-DC converter may not be needed. By way of example, the LED array 504 and the fan 512 may be designed for AC power. Alternatively, the power source may be DC, such as the case might be in automotive applications. The particular design of the power delivery circuit for any particular application is well within the capabilities of one skilled in the art.

Figure 6:
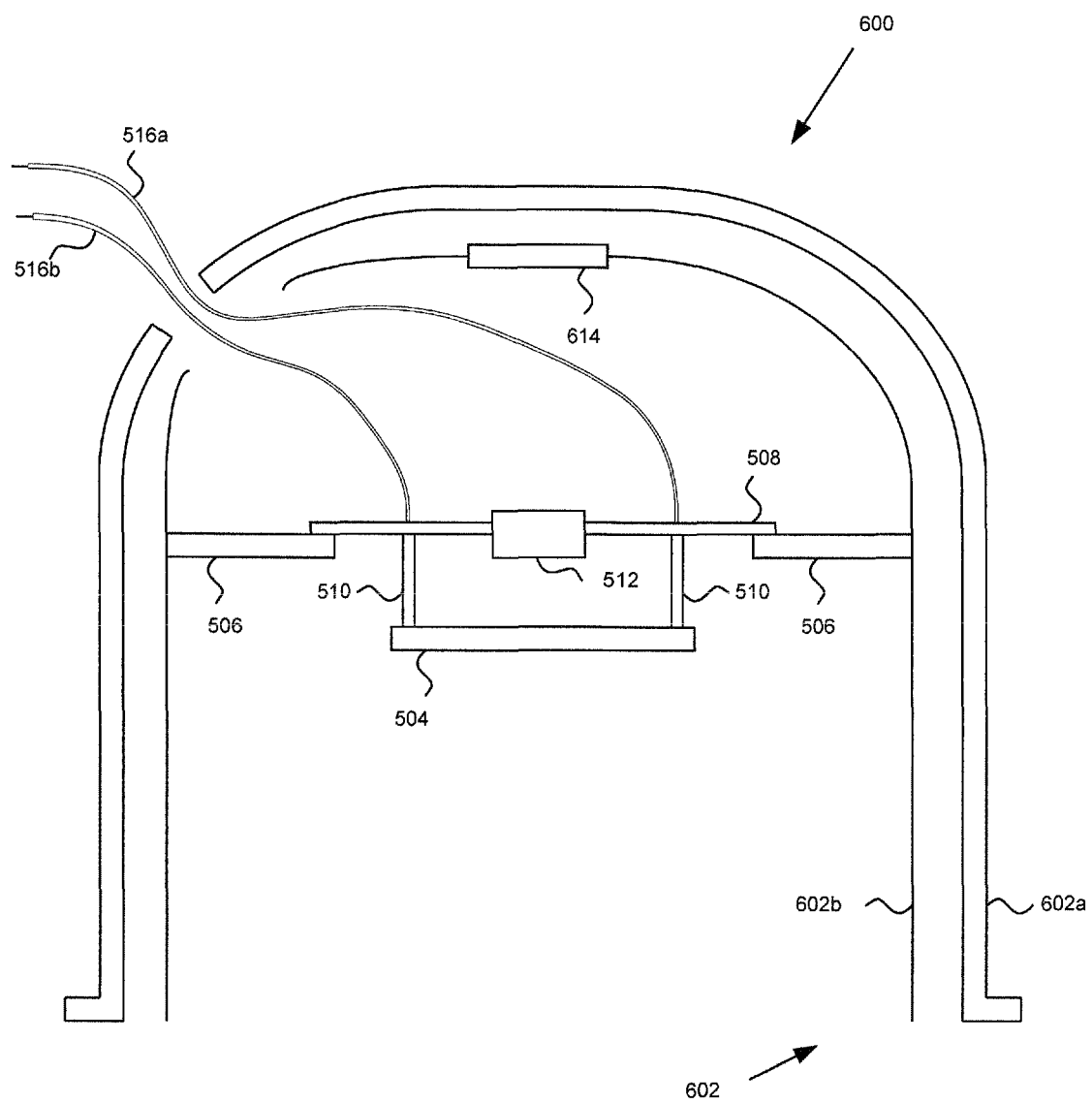
FIG. 6 is a conceptual side view of an LED luminaire for recessed lighting applications.

The light fixture 500 may take on various forms depending upon the particular application. In recessed lighting applications, for example, the light fixture 500 may be designed for insulation contact (IC) or non-insulation contact. An example of a light fixture 602 for IC applications in a recessed ceiling is shown in FIG. 6. The light fixture 602 is constructed with an outer shell 602a and an inner wall 602b. The inner wall 602b acts as a heat sink for the LED array 504. The fan 512 is positioned in the proximity of a vent 614 in the inner wall 602b, which enables air to flow in the gap between the two walls 602a, 602b. The air flow thermally insulates the outer shell 602a from the heated inner wall 602b, thereby protecting the insulation and other materials in the ceiling from heat and undesirable airflow.

The various aspects of this disclosure are provided to enable one of ordinary skill in the art to practice the present invention. Various modifications to aspects presented throughout this disclosure will be readily apparent to those skilled in the art, and the concepts disclosed herein may be extended to other LED lamp configurations regardless of the shape or diameter of the glass, plastic or other enclosure and the base and the arrangement of electrical contacts on the lamp. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A luminaire, comprising:
   a light fixture configured for at least one of a ceiling and a wall comprising:
   a heat conductive shell having an opening; and
      at least one LED positioned within the heat conductive shell to emit light through the opening; wherein
      the heat conductive shell further comprises a solid-state fan having no moving parts positioned to directly cool said at least one LED by moving air heated by the at least one LED through the opening, wherein said at least one LED and the fan are mounted on a plate and separated from each other by standoffs.

2. The luminaire of claim 1 wherein said at least one LED comprises an array of LEDs.

3. The luminaire of claim 1 further comprising phosphor, wherein each of said one LED is arranged to emit light through the phosphor.

4. The luminaire of claim 1 wherein the light fixture includes outer and inner walls forming air flow path therebetween.

5. The luminaire of claim 1 wherein the light fixture includes a vent.

6. A luminaire, comprising:
   at least one LED configured to emit light;
   a light fixture configured for at least one of a ceiling and a wall comprising a heat conductive shell containing said at least one LED, wherein the light fixture comprises a first opening and the heat conductive shell comprises a second a second opening configured to pass the light emitted from said at least one LED; and
   a solid-state fan having no moving parts positioned within the heat conductive shell to directly cool said at least one LED by moving air heated by the at least one LED through the first and second openings, wherein said at least one LED and the fan are mounted on a plate and separated from each other by standoffs.

7. The luminaire of claim 6 wherein said at least one LED comprises an array of LEDs.

8. The luminaire of claim 6 further comprising phosphor, wherein each of said one LED is arranged to emit light through the phosphor.

9. The luminaire of claim 6 wherein the light fixture includes an outer wall surrounding the heat conductive shell wherein the heat conductive shell includes a vent, thereby forming an air flow path from an interior space of the heat conductive shell to a space between the heat conductive shell and the outer wall.

10. A luminaire, comprising:
    a light fixture configured for at least one of a ceiling and a wall having a first opening, the light fixture comprising:
    a heat conductive shell having a second opening;
    at least one LED positioned within the heat conductive shell to emit light through the first and second openings, wherein said at least one LED is not in direct physical or thermal contact with a heat sink; and
    a solid-state fan having no moving parts positioned within the light fixture to directly cool said at least one LED by moving air heated by the at least one LED through the first and second openings, wherein said at least one LED and the fan are mounted on a plate and separated from each other by standoffs.

11. The luminaire of claim 10 wherein said at least one LED comprises an array of LEDs.

12. The luminaire of claim 10 further comprising phosphor, wherein each of said one LED is arranged to emit light through the phosphor.

13. The luminaire of claim 10 further comprising a plate supporting said at least one LED and the fan.

14. The luminaire of claim 10 wherein the light fixture includes outer and inner walls forming air flow path therebetween.

* * * * *